(12) United States Patent
Debbadi et al.

(10) Patent No.: US 11,935,807 B2
(45) Date of Patent: Mar. 19, 2024

(54) PLURALITY OF DIES ELECTRICALLY CONNECTED TO A PRINTED CIRCUIT BOARD BY A CLIP

(71) Applicant: Hamilton Sundstrand Corporation, Charlotte, NC (US)

(72) Inventors: Karthik Debbadi, Cork (IE); Sebastian Rosado, Cork (IE); Jeffrey Ewanchuk, Manchester, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 164 days.

(21) Appl. No.: 17/542,645

(22) Filed: Dec. 6, 2021

(65) Prior Publication Data
US 2022/0199483 A1     Jun. 23, 2022

(30) Foreign Application Priority Data
Dec. 21, 2020   (EP) ..................... 20216024

(51) Int. Cl.
| | |
|---|---|
| *H01L 23/367* | (2006.01) |
| *H01L 21/48* | (2006.01) |
| *H01L 23/00* | (2006.01) |
| *H01L 23/498* | (2006.01) |
| *H01L 25/00* | (2006.01) |
| *H01L 25/065* | (2023.01) |

(52) U.S. Cl.
CPC ........ *H01L 23/367* (2013.01); *H01L 21/4857* (2013.01); *H01L 23/49822* (2013.01); *H01L 24/40* (2013.01); *H01L 25/0655* (2013.01); *H01L 25/50* (2013.01); *H01L 2224/40225* (2013.01); *H01L 2224/40245* (2013.01); *H01L 2924/09701* (2013.01)

(58) Field of Classification Search
CPC ... H01L 25/0655; H01L 25/50; H01L 23/367; H01L 23/49822; H01L 23/5383; H01L 21/4857; H01L 24/40; H01L 24/34; H01L 24/41; H01L 2924/09701
See application file for complete search history.

(56) References Cited

U.S. PATENT DOCUMENTS

| | | |
|---|---|---|
| 8,617,927 B1 | 12/2013 | Margomenos et al. |
| 8,884,343 B2 | 11/2014 | Lange et al. |
| 9,659,854 B2 | 5/2017 | Klowak et al. |

(Continued)

FOREIGN PATENT DOCUMENTS

EP        0597144 A1    5/1994

OTHER PUBLICATIONS

EP0597144A1 Abstract, 2 pages, May 18, 1994.
Extended European Search Report for International Application No. 20216024.8 dated Jun. 22, 2021, 7 pages.

*Primary Examiner* — Alonzo Chambliss
(74) *Attorney, Agent, or Firm* — CANTOR COLBURN LLP

(57) ABSTRACT

A semiconductor device package includes a multilayer substrate including a top layer, a bottom layer and an intermediate layer between the top layer and the bottom layer. The package also includes one or more semiconductor dies embedded in the intermediate layer and conductive connector means to provide a conductive connection from the one or more dies. The conductive connector means extend through the top layer to provide connection means for one or more devices mounted on or adjacent the top layer.

10 Claims, 2 Drawing Sheets

(56) References Cited

U.S. PATENT DOCUMENTS

| | | |
|---|---|---|
| 10,163,798 B1 | 12/2018 | Alur et al. |
| 10,692,803 B2 | 6/2020 | Palm |
| 10,720,405 B2 | 7/2020 | Moitzi et al. |
| 10,730,745 B2 | 8/2020 | Lin et al. |
| 10,770,444 B2 | 9/2020 | Tuominen et al. |
| 10,796,998 B1 | 10/2020 | Macelwee |
| 2006/0281297 A1 | 12/2006 | Ogawa et al. |
| 2008/0165515 A1* | 7/2008 | Hsu ................. H01L 24/19 361/783 |
| 2010/0290191 A1 | 11/2010 | Lin et al. |
| 2015/0194362 A1* | 7/2015 | Otremba ............ H01L 24/18 257/676 |
| 2017/0171978 A1 | 6/2017 | Yang et al. |
| 2019/0378786 A1 | 12/2019 | Hejtmann et al. |
| 2020/0235067 A1 | 7/2020 | Kim et al. |
| 2023/0187370 A1* | 6/2023 | Chen ............... H01L 23/5385 257/668 |

* cited by examiner

PLURALITY OF DIES ELECTRICALLY CONNECTED TO A PRINTED CIRCUIT BOARD BY A CLIP

CROSS-REFERENCE TO RELATED APPLICATIONS

This application claims priority to European Patent Application No. 20216024.8 filed Dec. 21, 2020, the entire contents of which is incorporated herein by reference.

TECHNICAL FIELD

The present disclosure is concerned with a packaging for power semiconductor devices of a power module and a method of forming the packaging.

BACKGROUND

Power modules comprising semiconductor devices or dies are used in many fields, e.g., for converting or distributing electrical energy. Power modules find application in, for example, consumer and industrial applications, in the automotive industry, aeronautical fields and other areas. Such modules include semiconductor dies that perform switching or capacitive functions or as rectifiers or the like. A semiconductor die is configured to conduct a load current along a load current path between die terminals. To allow the semiconductor die to be assembled into a practical module, it needs to be provided in a package so that it can be coupled to other parts or components.

Conventionally, semiconductor die packaging involves mounting the die onto a substrate surface and to provide bonding wires to provide an electrical connection between the die terminals and connectors. In many applications, it is useful to be able to arrange devices having similar parameters in a symmetrical or parallel arrangement. Wide Band Gap (WBG) devices are particularly beneficial in this respect. Such conventional wire-bonded packaging, however, limits the degree to which dies can be paralleled and gives rise to asymmetries in power loop inductance i.e. can result in parasitic asymmetries. These conventional packages therefore do not allow the full benefits of WBG devices to be exploited.

An alternative solution, that overcomes the parasitic asymmetry problems of conventional packaging, is to use relatively new technique that allow multilayer substrates to be formed, whereby the dies are formed in a top or bottom layer of the structure and connector an insulator layers are also provided. Whilst such multilayer structures provide improvements over conventional packaging in terms of inductance and providing higher symmetry for paralleled WBG devices, they have a higher thermal impedance than such conventional packages. Heat cannot, therefore, be dissipated as effectively with such multilayer packages.

There is, therefore, a need for a semiconductor device package that allows the benefits of parallel devices to be exploited whilst providing a low thermal impedance.

SUMMARY

According to one aspect, there is provided a semiconductor device package comprising a multilayer substrate including a top layer, a bottom layer and an intermediate layer between the top layer and the bottom layer, and one or more semiconductor dies embedded in the intermediate layer, and further comprising conductive connector means to provide a conductive connection from the one or more dies, the conductive connector means extending through the top layer to provide connection means for one or more devices mounted on or adjacent the top layer.

According to another aspect, there is provided a method of forming a semiconductor device package comprising embedding one or more semiconductor dies in a ceramic substrate layer, providing a top substrate layer over one side of the ceramic substrate layer and a bottom substrate layer over an opposite side of the ceramic substrate layer; providing a conductive connection from the one or more dies through the top layer to provide a connection for one or more devices mounted on or adjacent the top layer.

Preferably the intermediate layer includes a ceramic layer and a conductive layer, e.g., copper, and the one or more semiconductor dies is embedded in the ceramic layer and in electrical contact with the conductive layer.

The conductive connector means may comprise a clip of conductive material e.g., copper, connected to the one or more semiconductor dies.

One or more bus bar components and/or pcbs may be mounted on the top layer on a side away from the intermediate layer.

A plurality of semiconductor dies may be arranged in a parallel pattern.

DETAILED DESCRIPTION

Figure 1:
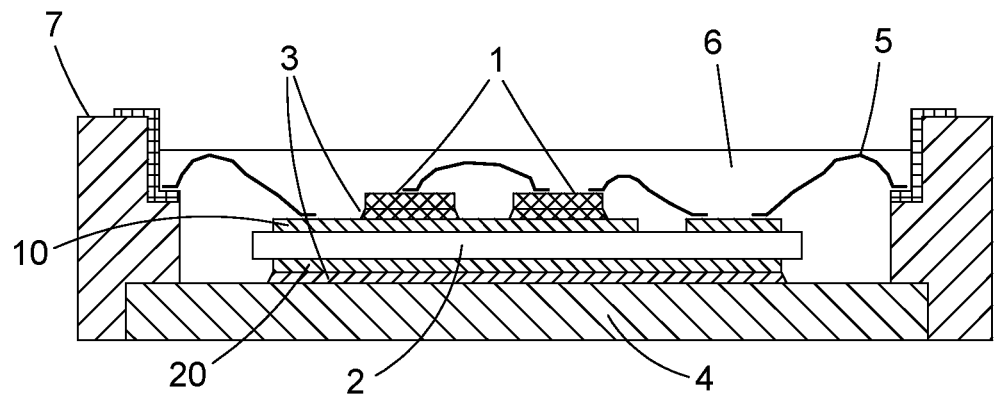
FIG. 1 shows a section view of a conventional semiconductor die package.

In conventional wire-bonded packages as shown in FIG. 1, the semiconductor components 1 (in this example, a diode and an IGBT, but these can of course be any known semiconductor components depending on the function of the device) are mounted on an upper substrate layer 10 by means of a bonding material 3, The upper substrate layer 10 is mounted to a lower substrate layer 20 via an intermediate insulating substrate layer 2. The resulting package is mounted to a base plate 4 by means of the bonding material 3. Wire bonds 5 are provided between the semiconductor components 1 and from the components 1 to connector terminals etc. and the device is mounted in a housing or case 7 made of e.g., plastic. A potting or encapsulating material 6 can be provided over the components and substrate layers to protect the device parts and provide an integral device package. The base plate acts as a heat sink and may be provided with coolant to improve thermal dissipation. For improved cooling, cooling plates can be provided on both sides of the package. In other arrangements, the components may be mounted on a bottom substrate layer and heat could be dissipated through the upper layer. Such conventional packaging structures have a high technological maturity and can be quickly and easily manufactured at low cost. As mentioned above, however, such structures are limited as regards parasitic symmetry control. The type of packaging materials used in conventional packaging are usually limited to a temperature range of around 150 to 175 deg. C.

Multilayer substrate structures in which the semiconductor components are formed in the top or bottom layer of the structure better allow components to be paralleled without the problems or parasitic asymmetries. The semiconductor layers are usually bonded to the top layer of the multilayer substrate and heat is transported through the bottom layer. A copper layer provides the electrical connections. Such structures, however, have a much higher thermal impedance than wire-bonded structures.

The structure of the present disclosure aims to use a multilayer substrate structure to achieve the benefits of paralleling and reduced parasitic asymmetries but to retain the thermal advantages of wire-bonded structures.

Figure 2:
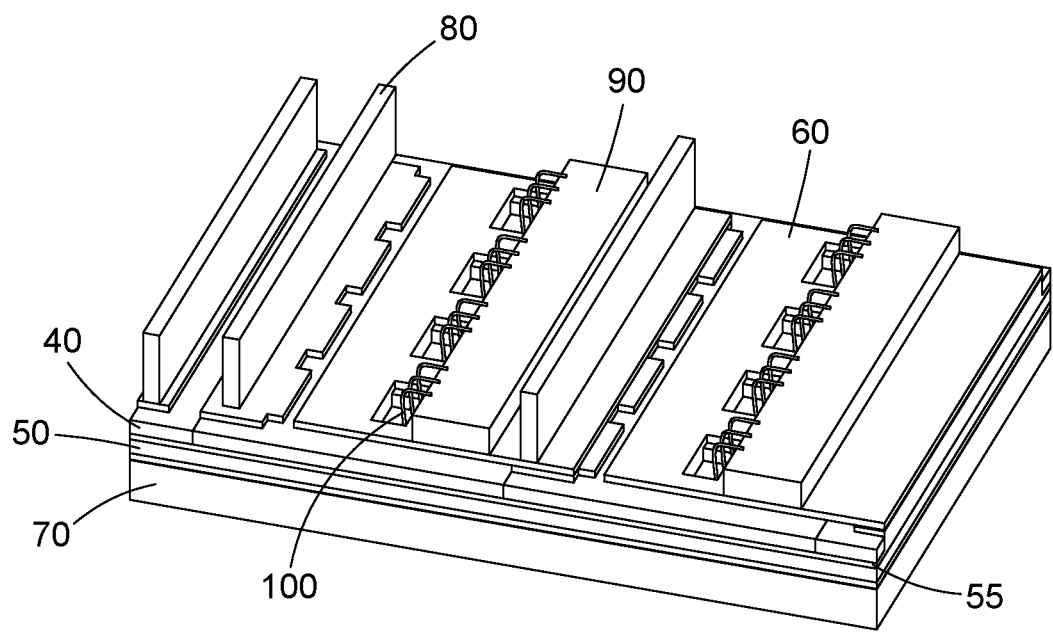
FIG. 2 is a perspective view of a semiconductor die package according to this disclosure.
Figure 3:
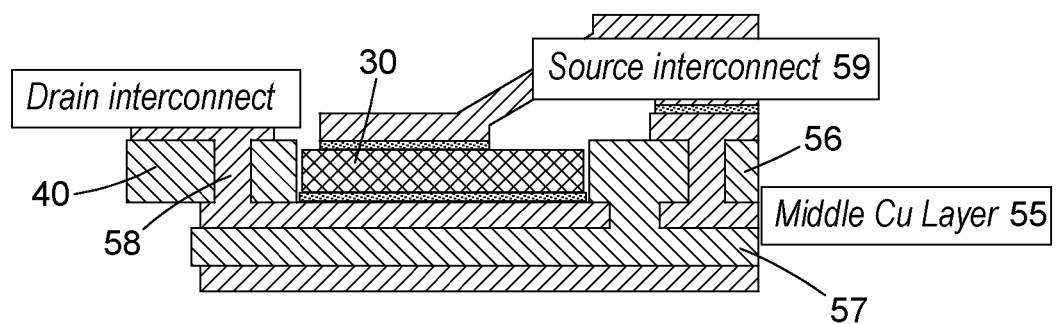
FIG. 3 is a section view of a detail of the package of FIG. 2.
Figure 4:
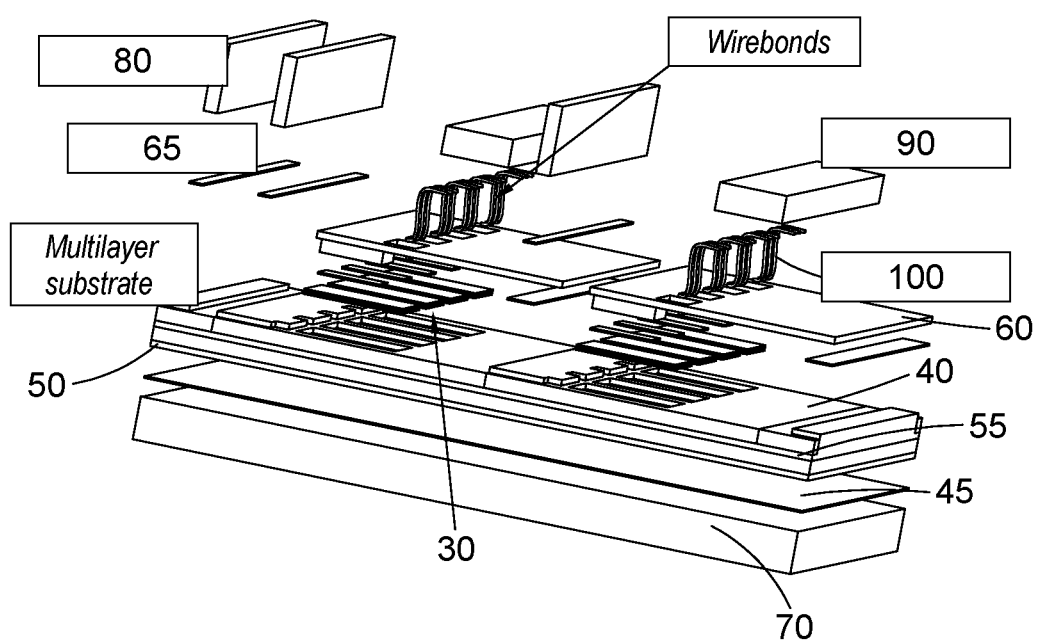
FIG. 4 is an exploded view of the package of FIG. 2

As shown in FIGS. 2 to 4, according to the present disclosure, the semiconductor dies 30 are embedded into a layer 40 of the multilayer structure intermediate the top 60 and bottom 70, or base plate, layer, thus reducing heat flow resistance to the bottom, heat dissipating base layer 70.

In the example shown. The device includes four parallel semiconductor dies 30 embedded into the intermediate layer 40. This is just by means of example and any type of or number of dies may be provided in any desired pattern. The intermediate layer 40 is bonded to a bottom layer or base plate 70 e.g., by welding or solder 45 or other bonding material or process. A top layer 60 is mounted over the intermediate layer 40 and bonded thereto e.g., by solder 65 or other bonding material. The layers are mounted to a base plate 70 to which they are secured by e.g., welding, solder 45 or other bonding material or process.

Other components are formed on the top layer 60, e.g., bus bars 80, PCB 90 etc.

The intermediate layer 40 has a sandwich structure of ceramic layers 56, 57 separated by an intermediate copper or other conductive layer 55. As can be best seen in FIG. 3, the component 30 is embedded in the intermediate ceramic layer and is bonded to the intermediate copper layer 55. To connect the drain of the component to the pcb 90, an interconnect 58 can be formed from the intermediate copper layer on which the component is mounted, through the ceramic layer 56. The source is connected to the pcb via a source interconnect 59 directly connected to the component source.

In the preferred embodiment, these interconnects 58, 59 are provided by means of copper or other conductive clips 100 that pass through the top layer 60, at one end, to contact the component 30 in the intermediate layer, and, at the other end, connect with devices or components on the top layer of the package such as the pcb. The use of such a clip reduces loop inductance and can also provide better thermal extraction on the top side of the package as well as at the bottom.

Although the connections between the layers may be more complex than conventional multilayer substrate structures where the components are mounted on the top layer, the use of additive manufacturing techniques can greatly simplify this and so the complexity does not provide any serious disadvantage. Subtractive manufacturing is also a possibility.

The use of multilayer substrate design means that dies can be mounted in parallel with a high degree of symmetry which means that a greater number of devices can be utilised in the power module. The simple mounting of components such as bus bars avoids the need for complex bus bar design which would otherwise add to the overall size and weight of the package. The benefits of multilayer substrates, including increased switching speed and greater component density are thus retained whilst reducing thermal impedance compared to known multilayer designs. Therefore, additional heat conducting components are not required which would otherwise add to the size and weight of the device.

The invention claimed is:

1. A semiconductor device package comprising:
   a multilayer substrate including a top layer, a bottom layer and an intermediate layer between the top layer and the bottom layer; and
   one or more semiconductor dies embedded in the intermediate layer;
   conductive connector means to provide a conductive connection from the one or more dies, the conductive connector means extending through the top layer to provide connection means for one or more devices mounted on or adjacent the top layer;
   wherein the intermediate layer includes a ceramic layer and a conductive layer, and wherein the one or more semiconductor dies is embedded in the ceramic layer and in electrical contact with the conductive layer;
   wherein the conductive connector means comprises a clip of conductive material connected to the one or more semiconductor dies.

2. The semiconductor device package of claim 1, wherein the conductive layer is a copper layer.

3. The semiconductor device package of claim 1 wherein the clip is made of copper.

4. The semiconductor device package of claim 1, further comprising:
   one or more bus bar components mounted on the top layer on a side away from the intermediate layer.

5. The semiconductor device package of claim 1, further comprising:
   one or more printed circuit boards mounted on the top layer on a side away from the intermediate layer.

6. The semiconductor device package of claim 1, comprising a plurality of semiconductor dies arranged in a parallel pattern.

7. The semiconductor device package of claim 1, wherein the bottom layer is a heat sink.

8. A method of forming a semiconductor device package comprising:
   embedding one or more semiconductor dies in a ceramic substrate layer;
   providing a top substrate layer over one side of the ceramic substrate layer and a bottom substrate layer over an opposite side of the ceramic substrate layer;
   providing a conductive connection from the one or more dies through the top layer to provide a connection for one or more devices mounted on or adjacent the top layer; and
   mounting one or more printed circuit boards on the top layer on a side away from the intermediate layer.

9. The method of claim 8, further comprising mounting one or more bus bar components on the top layer on a side away from the intermediate layer.

10. The method of claim 8, further comprising providing a plurality of semiconductor dies arranged in a parallel pattern.

* * * * *